US010778177B2

(12) United States Patent
Oomori et al.

(10) Patent No.: US 10,778,177 B2
(45) Date of Patent: Sep. 15, 2020

(54) COMMON MODE NOISE FILTER

(71) Applicant: Panasonic Intellectual Property Management Co., Ltd., Osaka (JP)

(72) Inventors: Yoshiharu Oomori, Osaka (JP); Kenichi Matsushima, Hyogo (JP); Takeshi Ichihara, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/305,409

(22) PCT Filed: Aug. 31, 2017

(86) PCT No.: PCT/JP2017/031295
§ 371 (c)(1),
(2) Date: Nov. 29, 2018

(87) PCT Pub. No.: WO2018/051798
PCT Pub. Date: Mar. 22, 2018

(65) Prior Publication Data
US 2019/0333673 A1    Oct. 31, 2019

(30) Foreign Application Priority Data

Sep. 13, 2016    (JP) .............................. 2016-178162

(51) Int. Cl.
*H03H 7/42*    (2006.01)
*H03H 7/09*    (2006.01)
(Continued)

(52) U.S. Cl.
CPC ......... *H03H 7/427* (2013.01); *H01F 17/0013* (2013.01); *H01F 27/29* (2013.01);
(Continued)

(58) Field of Classification Search
CPC .. H03H 7/42; H03H 7/427; H03H 2001/0085; H03H 1/0007; H03H 7/09; H01F 17/0013
(Continued)

(56) References Cited

U.S. PATENT DOCUMENTS

2017/0316869 A1    11/2017 Omori et al.

FOREIGN PATENT DOCUMENTS

| JP | 2002-373810 A | 12/2002 |
| JP | 2009-212255 | 9/2009 |

(Continued)

OTHER PUBLICATIONS

JP2013138146, machine translation (Year: 2013).*
International Search Report of PCT application No. PCT/JP2017/031295 dated Oct. 24, 2017.

*Primary Examiner* — Rakesh B Patel
(74) *Attorney, Agent, or Firm* — McDermott Will & Emery LLP

(57) ABSTRACT

A common mode noise filter includes a laminated body including first to fourth insulating layers stacked on one another, first to fourth coil conductors spirally extending and disposed on upper surfaces of the first to fourth insulating layers, respectively, a first via-electrode connecting the first coil conductor to the second coil conductor, a second via-electrode connecting the third coil conductor to the fourth coil conductor, first and second connection parts connecting the first via-electrode to first and second inner ends of the first and second coil conductors, respectively, and third and fourth connection parts connecting the second via-electrode to third and fourth inner ends of the third and fourth coil conductors, respectively. The first connection part overlaps the second connection part when viewed from above. The (Continued)

third connection part overlaps the fourth connection part when viewed from above. The common mode noise filter is operable in high frequencies.

42 Claims, 9 Drawing Sheets

(51) Int. Cl.
    *H03H 17/00*     (2006.01)
    *H01F 17/00*     (2006.01)
    *H01F 27/29*     (2006.01)
    *H01F 41/04*     (2006.01)

(52) U.S. Cl.
    CPC ............... *H01F 41/04* (2013.01); *H03H 7/09* (2013.01); *H01F 2017/002* (2013.01); *H01F 2017/0093* (2013.01)

(58) Field of Classification Search
    USPC .................................................. 333/181, 185
    See application file for complete search history.

(56) References Cited

FOREIGN PATENT DOCUMENTS

| | | |
|---|---|---|
| JP | 2013-122940 | 6/2013 |
| JP | 2013-138146 | 7/2013 |
| JP | 2014-192425 A | 10/2014 |
| WO | 2016/079903 A1 | 5/2016 |

* cited by examiner

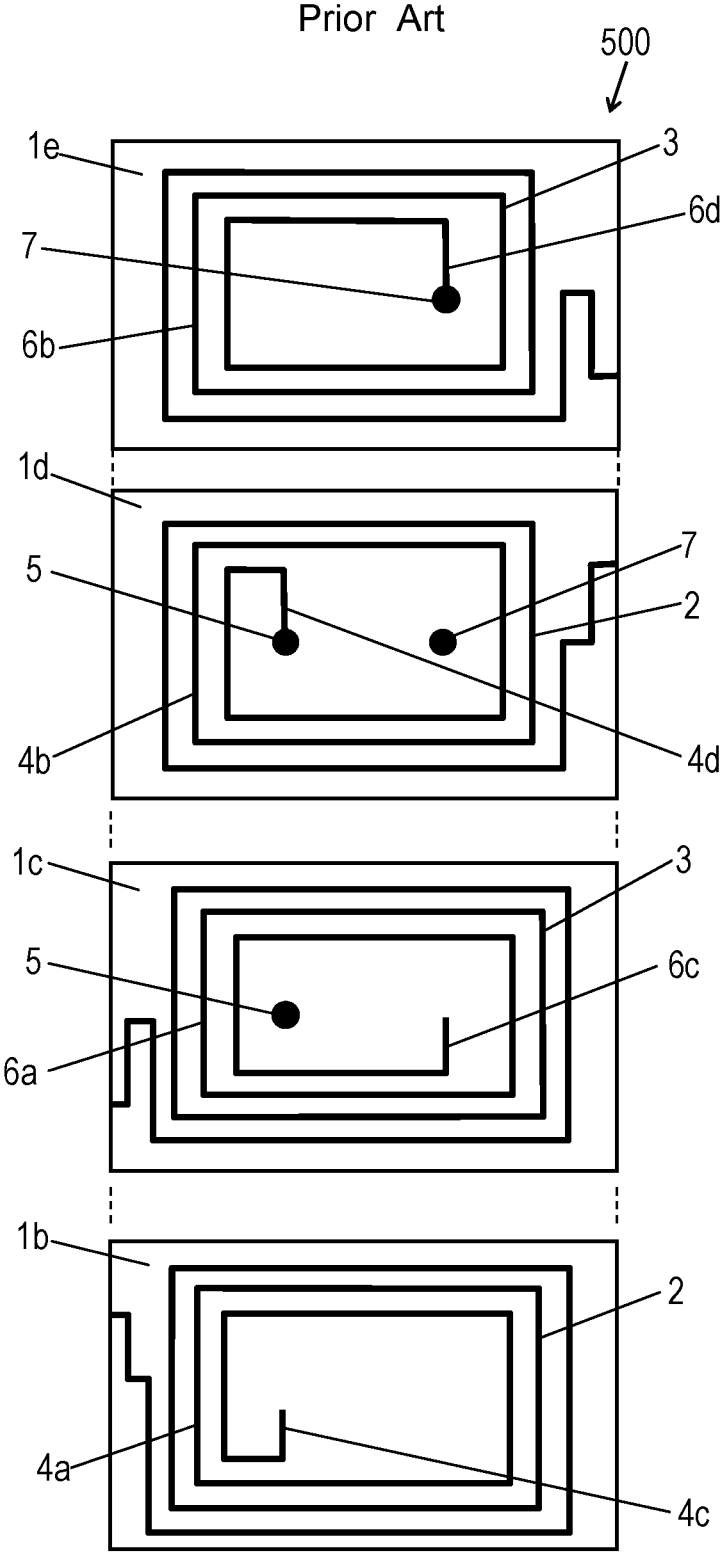

COMMON MODE NOISE FILTER

CROSS-REFERENCE TO RELATED APPLICATIONS

This application is a U.S. national stage application of the PCT international application No. PCT/JP2017/031295 filed on Aug. 31, 2017, which claims the benefit of foreign priority of Japanese patent application No. 2016-178162 filed on Sep. 13, 2016, the contents all of which are incorporated herein by reference.

TECHNICAL FIELD

The present invention relates to a small common mode noise filter with a low profile operable for use in a wide range of electronic equipment that includes digital equipment, audio-visual equipment, and information communication terminals.

BACKGROUND ART

FIG. 7 is an exploded perspective view of conventional common mode noise filter 500. Common mode noise filter 500 includes coils 2 and 3 formed on insulating layers 1a to 1g that are stacked on one another. Coil 2 includes coil conductors 4a and 4b having spiral shapes. Coil conductors 4a and 4b are connected to each other via via-electrode 5. Coil 3 includes coil conductors 6a and 6b having spiral shapes. Coil conductors 6a and 6b are connected to each other via via-electrode 7. Coil conductors 4a and 4b are arranged alternately with coil conductors 6a and 6b.

FIG. 8 is top views of insulating layers 1b to 1e of common mode noise filter 500. Coil conductors 4a, 4b, 6a, and 6b are connected to respective external electrodes formed on edge surfaces of the insulating layers.

Common mode noise filter 500 further includes connection part 4c that connects coil conductor 4a to via-electrode 5, connection part 4d that connects coil conductor 4b to via-electrode 5, connection part 6c that connects coil conductor 6a to via-electrode 7, and connection part 6d that connects coil conductor 6b to via-electrode 7. Connection part 4c does not overlap connection part 4d when viewed from above. Connection part 6c does not overlap connection part 6d when viewed from above.

FIG. 8 illustrates coil conductor 6b formed on insulating layer 1e, coil conductor 4b formed on insulating layer 1d, coil conductor 6a formed on insulating layer 1c, and coil conductor 4a formed on insulating layer 1b.

A conventional common mode noise filter similar to common mode noise filter 500 is disclosed in, e.g. PTL 1.

CITATION LIST

Patent Literature

PTL 1: Japanese Patent Laid-Open Publication No. 2013-122940

SUMMARY

A common mode noise filter includes a laminated body including first to fourth insulating layers stacked on one another, first to fourth coil conductors spirally extending to be disposed on upper surfaces of the first to fourth insulating layers, respectively, a first via-electrode that passes through at least one of the first to fourth insulating layers so as to connect the first coil conductor to the second coil conductor, a second via-electrode that passes through at least one of the first to fourth insulating layers so as to connect the third coil conductor to the fourth coil conductor, a first connection part that connects the first via-electrode to a first inner end of the first coil conductor, a second connection part that connects the first via-electrode to a second inner end of the second coil conductor, a third connection part that connects the second via-electrode to a third inner end of the third coil conductor, and a fourth connection part that connects the second via-electrode to a fourth inner end of the fourth coil conductor. The first connection part overlaps the second connection part when viewed from above. The third connection part overlaps the fourth connection part when viewed from above.

The common mode noise filter is operable in high frequencies.

BRIEF DESCRIPTION OF DRAWINGS

FIG. 8 is a top view of a main part of the conventional common mode noise filter.

DETAIL DESCRIPTION OF PREFERRED EMBODIMENT

Figure 1:
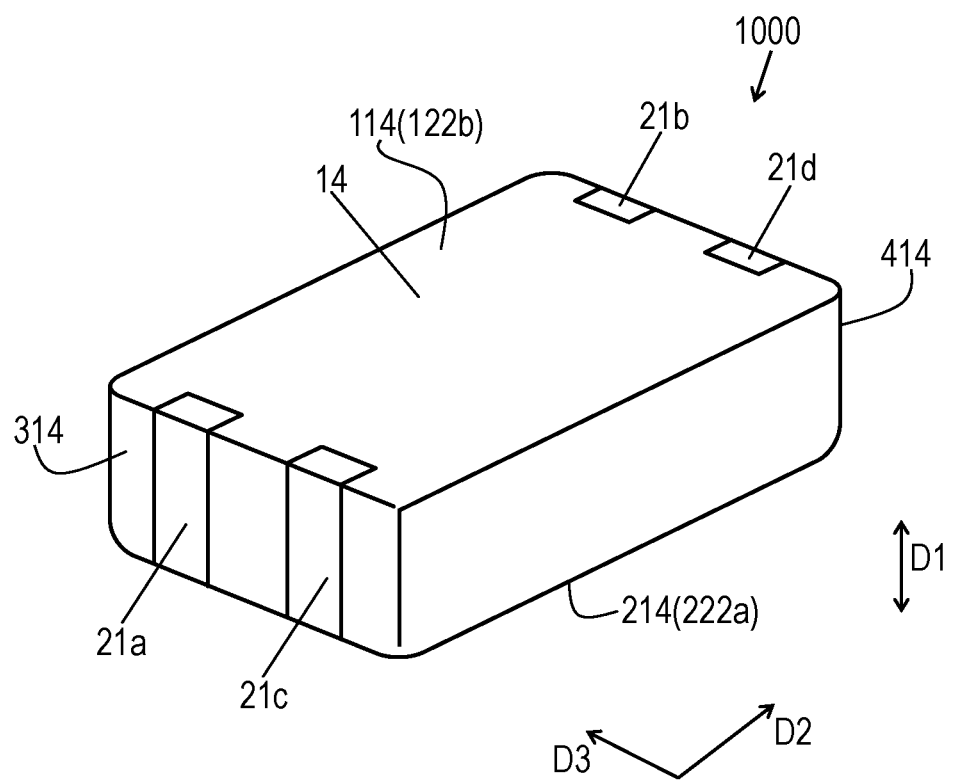
FIG. 1 is a perspective view of a common mode noise filter according to an exemplary embodiment.
Figure 2A:
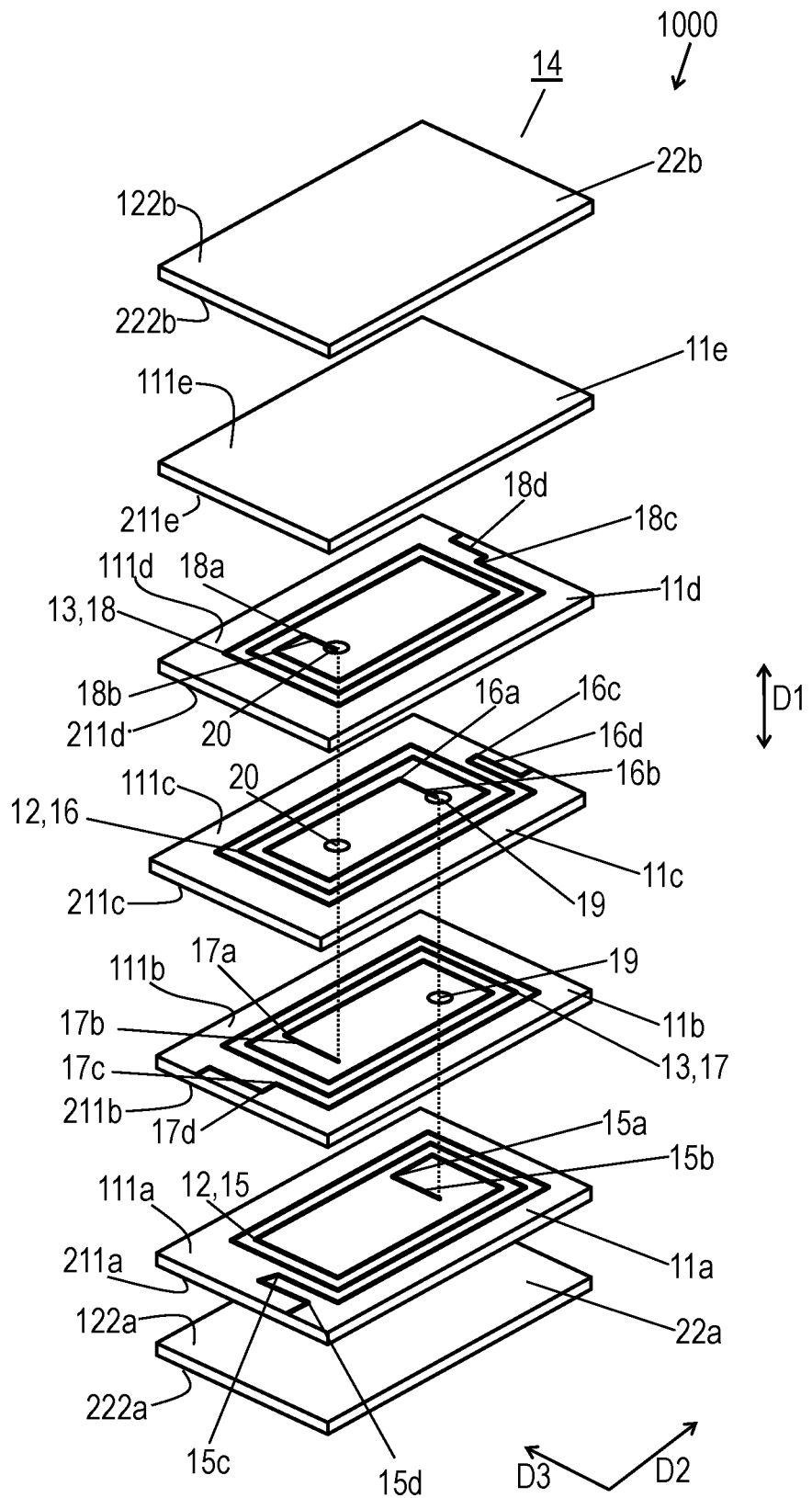
FIG. 2A is an exploded perspective view of the common mode noise filter according to the embodiment.
Figure 2B:
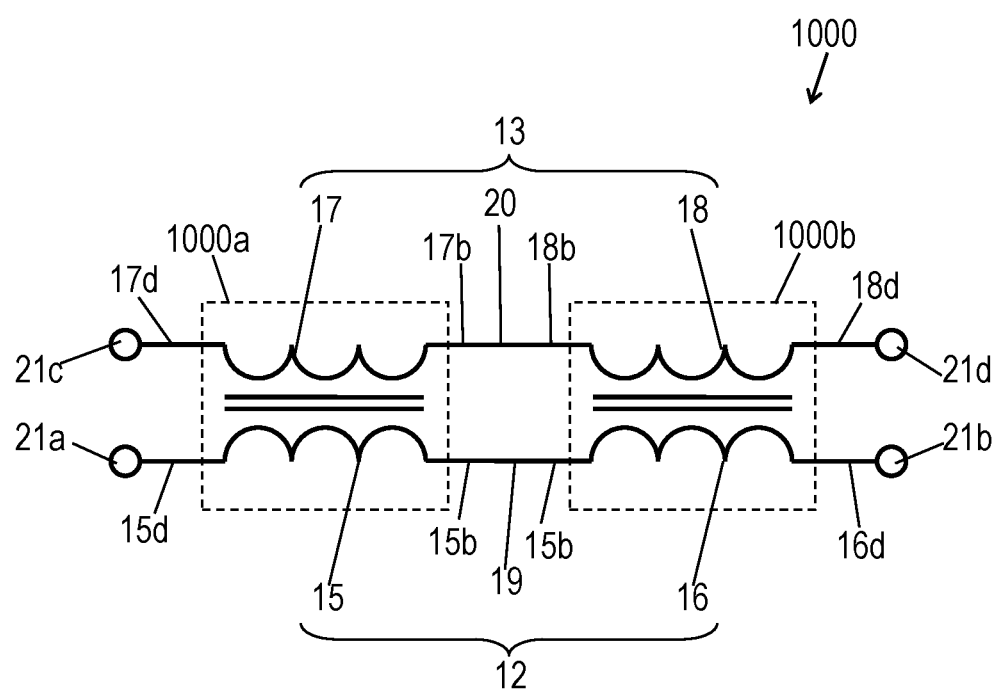
FIG. 2B is a circuit diagram of the common mode noise filter according to the embodiment.
Figure 3:
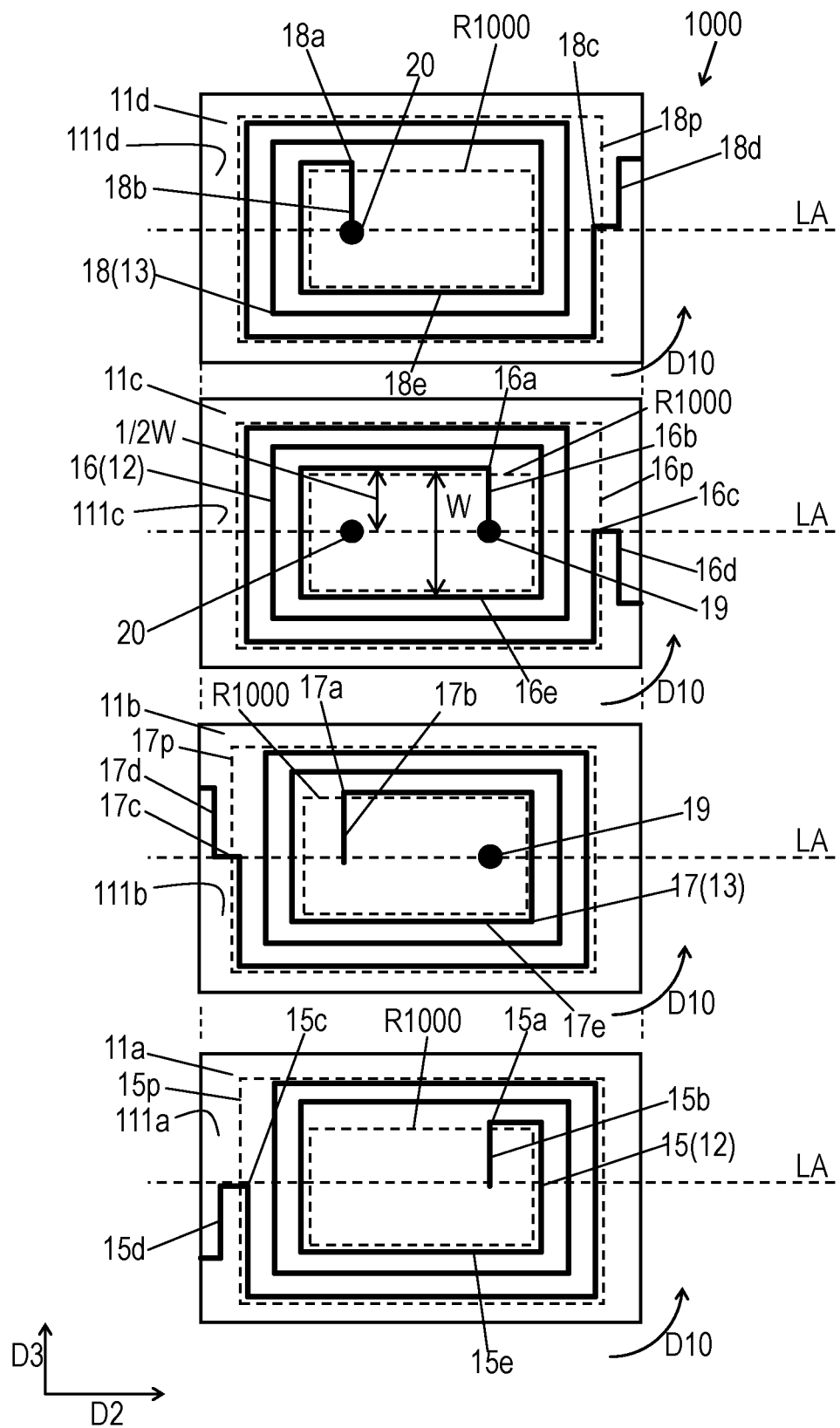
FIG. 3 is a top view of insulating layers of the common mode noise filter according to the embodiment.

FIG. 1 is a perspective view of common mode noise filter 1000 according to an embodiment. FIG. 2A is an exploded perspective view of common mode noise filter 1000. FIG. 2B is a circuit diagram of common mode noise filter 1000. FIG. 3 is a top view of insulating layers of common mode noise filter 1000. Common mode noise filter 1000 includes insulating layers 11a to 11e stacked on one another in up-down direction D1 and coils 12 and 13 formed on insulating layers 11a to 11e. Insulating layers 11a to 11e have rectangular shapes when viewed from above. Insulating layers 11a to 11e and coils 12 and 13 constitute laminated body 14 having a rectangular parallelepiped shape. Coil 12 includes coil conductors 15 and 16 having spiral shapes. Coil 13 includes coil conductors 17 and 18 having spiral shapes. Coil conductors 15 and 16 which constitute coil 12 are arranged alternately in up-down direction D1 with coil conductors 17 and 18 which constitute coil 13. Coil conductor 15 is connected in series to coil conductor 16 via via-electrode 19 that passes through insulating layers 11b and 11c. Coil conductor 17 is connected in series to coil conductor 18 via via-electrode 20 that passes through insulating layers 11c and 11d.

Common mode noise filter 1000 further includes connection part 15b that connects inner end 15a of coil conductor 15 to via-electrode 19, connection part 16b that connects inner end 16a of coil conductor 16 to via-electrode 19, connection part 17b that connects inner end 17a of coil conductor 17 to via-electrode 20, and connection part 18b that connects inner end 18a of coil conductor 18 to via-electrode 20. Connection part 15b overlaps connection part 16b when viewed from above. Connection part 17b overlaps connection part 18b when viewed from above.

External electrodes 21a and 21c are formed on edge surface 314 of laminated body 14. External electrodes 21b and 21d are formed on edge surface 414 of laminated body 14 opposite to edge surface 314.

Insulating layer 11a is made of non-magnetic material, such as Cu—Zn ferrite or glass ceramic, thereby having an insulating property and a rectangular sheet shape.

Coil conductor 15 is formed on upper surface 111a of insulating layer 11a by plating or printing a conductive material, such as silver, in a spiral shape on upper surface 111a of insulating layer 11a. Inner end 15a of coil conductor 15 is connected to connection part 15b, thereby being connected to via-electrode 19 via connection part 15b. Outer end 15c of coil conductor 15 is connected to lead part 15d. Lead part 15d is connected to external electrode 21a.

Insulating layer 11b is made of a non-magnetic material, such as Cu—Zn ferrite or glass ceramic, thereby having an insulating property and a rectangular sheet shape. Insulating layer 11b is formed on an upper surface of coil conductor 15. In insulating layer 11b, via-electrode 19 passes through insulating layer 11b from upper surface 111b to lower surface 211b of insulating layer 11b. Connection part 15b is connected to via-electrode 19.

Coil conductor 17 is formed on upper surface 111b of insulating layer 11b by plating or printing a conductive material, such as silver, in a spiral shape on upper surface 111b of insulating layer 11b. Inner end 17a of coil conductor 17 is connected to connection part 17b, thereby being connected to via-electrode 20 via connection part 17b. Outer end 17c of coil conductor 17 is connected to lead part 17d. Lead part 17d is connected to external electrode 21c.

Coil conductor 15 and coil conductor 17 are wound in the same winding direction D10 so as to overlap each other when viewed from above. This configuration causes these conductors to be magnetically coupled to each other.

Insulating layer 11c is made of non-magnetic material, such as Cu—Zn ferrite or glass ceramic, thereby having an insulating property and a rectangular sheet shape. Insulating layer 11c is formed on an upper surface of coil conductor 17. Via-electrode 19 and via-electrode 20 are formed to pass through insulating layer 11c from upper surface 111c to lower surface 211c of insulating layer 11c. Connection part 17b is connected to via-electrode 20.

Coil conductor 16 is formed on upper surface 111c of insulating layer 11c by plating or printing a conductive material, such as silver, in a spiral shape on upper surface 111c of insulating layer 11c. Inner end 16a of coil conductor 16 is connected to connection part 16b, thereby being connected to via-electrode 19 via connection part 16b. Outer end 16c of coil conductor 16 is connected to lead part 16d. Lead part 16d is connected to external electrode 21b.

Connection part 15b is connected to connection part 16b via via-electrode 19 that passes through insulating layers 11b and 11c. This causes coil conductors 15 and 16 to be connected in series to each other, thereby constituting coil 12.

Insulating layer 11d is made of non-magnetic material, such as Cu—Zn ferrite or glass ceramic, thereby having an insulating property and a rectangular sheet shape. Insulating layer 11d is formed on an upper surface of coil conductor 16. Via-electrode 20 passes through insulating layer 11d from upper surface 111d to lower surface 211d of insulating layer 11d.

Coil conductor 18 is formed on upper surface 111d of insulating layer 11d by plating or printing a conductive material, such as silver, in a spiral shape on upper surface 111d of insulating layer 11d. Inner end 18a of coil conductor 18 is connected to connection part 18b, thereby being connected to via-electrode 20 via connection part 18b. Outer end 18c of coil conductor 18 is connected to lead part 18d. Lead part 18d is connected to external electrode 21d.

Connection part 17b is connected to connection part 18b via via-electrode 20 passes through insulating layers 11d and 11c. This causes coil conductors 17 and 18 to be connected in series to each other, thereby constituting coil 13.

Coil conductors 16 and 18 are wound in the same winding direction D10 so as to overlap each other when viewed from above. This configuration causes these conductors to be magnetically coupled to each other. Coil conductors 15 to 18 are wound in the same winding direction D10. This causes electric currents to flow through coil conductors 15 to 18 in the same direction when viewed from above.

Coil conductors 15 and 16 constituting coil 12 are arranged alternately in up-down direction D1 with coil conductors 17 and 18 constituting coil 13.

Via-electrode 20 connected to coil conductor 18, the uppermost layer, is farther away from external electrode 21d connected to coil conductor 18 than via-electrode 19 when viewed from above. Via-electrode 19 connected to coil conductor 16 is closer to external electrode 21b than via-electrode 20 when viewed from above. Via-electrode 19 connected to coil conductor 15, the lowermost layer, is farther away from external electrode 21a than via-electrode 20 when viewed from above. Via-electrode 20 connected to coil conductor 17 is closer to external electrode 21c than via-electrode 19 when viewed from above.

Inner end 17a of coil conductor 17 overlaps coil conductor 15 when viewed from above. A portion of coil conductor 15 located between inner end 17a and outer end 15c when viewed from above overlaps coil conductor 17 between inner end 17a and outer end 17c when viewed from above. In accordance with the embodiment, outer end 15c of coil conductor 15 overlaps outer end 17c of coil conductor 17 when viewed from above. Inner end 16a of coil conductor 16 overlaps coil conductor 18 when viewed from above. A portion of coil conductor 18 located between inner end 16a and outer end 18c when viewed from above overlaps coil conductor 16 between inner end 16a and outer end 16c when viewed from above. This configuration maximizes the lengths of portions of coil conductors 15 and 17 overlapping each other, thereby largely magnetically coupling coil conductors 15 and 17 to each other. This configuration also maximizes the lengths of portions of coil conductors 16 and 18 overlapping each other, thereby largely magnetically coupling coil conductors 16 and 18 to each other. This configuration largely reduces common mode noises.

Insulating layer 11e is made of non-magnetic material, such as Cu—Zn ferrite or glass ceramic, thereby having an insulating property and a rectangular sheet shape. Insulating layer 11e is formed on an upper surface of coil conductor 18.

Insulating layer 22a is disposed on lower surface 211a of insulating layer 11a. Insulating layer 22b is disposed on upper surface 111e of insulating layer 11e. Insulating layers 22a and 22b are made of non-magnetic material, such as Cu—Zn ferrite or glass ceramic, thereby having insulating properties and rectangular sheet shapes. Insulating layers 22a and 22b may be made of magnetic material or, alternatively, may include magnetic and non-magnetic layers stacked alternately on one another.

Insulating layers 11a to 11e, 22a, and 22b have upper surfaces 111a to 111e, 122a, and 122b, and lower surfaces 211a to 211e, 222a, and 222b, respectively. Lower surface 211a of insulating layer 11a is situated on upper surface 122a of insulating layer 22a. Lower surface 211b of insulating layer 11b is situated on upper surface 111a of insulating layer 11a. Lower surface 211c of insulating layer 11c is situated on upper surface 111b of insulating layer 11b. Lower surface 211d of insulating layer 11d is situated on upper surface 111c of insulating layer 11c. Lower surface 211e of insulating layer 11e is situated on upper surface 111d of insulating layer 11d. Lower surface 222b of insulating layer 22b is situated on upper surface 111e of insulating layer 11e. Insulating layers 11a to 11e, 22a, and 22b which are stacked on another constitute laminated body 14 having substantially s rectangular parallelepiped shape. Lower surface 222a of insulating layer 22a constitutes lower surface 214 of laminated body 14 while upper surface 122b of insulating layer 22b constitutes upper surface 114 of laminated body 14. The number of insulating layers 11a to 11e, 22a, and 22b is not limited to the number shown in FIG. 2A. External electrodes 21a to 21d are disposed on edge surfaces 314 and 414 of laminated body 14. External electrodes 21a to 21d are electrically connected to lead parts 15d to 18d, respectively.

In common mode noise filter 1000 shown in FIG. 2A, coil conductor 15 disposed on upper surface 111a of insulating layer 11a is located on lower surface 211b of insulating layer 11b. Coil conductor 17 disposed on upper surface 111b of insulating layer 11b is located on lower surface 211c of insulating layer 11c. Coil conductor 16 disposed on upper surface 111c of insulating layer 11c is located on lower surface 211d of insulating layer 11d. Coil conductor 18 disposed on upper surface 111d of insulating layer 11d is located on lower surface 211e of insulating layer 11e.

Insulating layers 11a to 11e, 22a, and 22b have rectangular shapes with long-side direction D2 and short-side direction D3. That is, each of insulating layers 11a to 11e, 22a, and 22b has a rectangular shape having long sides which extend in long-side direction D2 and short sides which extend in short-side direction D3 perpendicular to long-side direction D2 and are shorter than the long sides. Laminated body 14 has the rectangular parallelepiped shape having a rectangular shape, when viewed from above, that has long sides which extend in long-side direction D2 and short sides which extend in short-side direction D3 and are shorter than the long sides. Coil conductors 15 to 18 have outer borders 15p to 18p, respectively. Each of outer borders 15p to 18p has a rectangular shape having long sides which extend in long-side direction D2 and short sides which extend in short-side direction D3 perpendicular to long-side direction D2 and are shorter than the long sides. Each of coil conductors 15 to 18 has a spiral shape such that portions of each coil conductor which extend in long-side direction D2 are longer than portions of each coil conductor which extend in short-side direction D3. Each of coil conductors 15 to 18 includes a portion that faces respective one of sides of laminated body 14 in long-side direction D2. At least a part of the portion extends linearly substantially in parallel with the respective one of the sides of laminated body 14.

Common mode noise filter 1000 may further include a magnetic via-material made magnetic material that fills a through-hole disposed inside coils 12 and 13 when viewed from above. The through-hole passes from an upper surfaces to a lower surface of at least one of insulating layers 11a to 11e through at least one of insulating layers 11a to 11e made of non-magnetic material. This configuration allows common mode noise filter 1000 to increase impedance against currents of a common mode.

As described above, laminated body 14 includes insulating layers 11a to 11d stacked on one another in up-down direction D1. Coil conductor 15 is disposed on upper surface 111a of insulating layer 11a, and extends spirally from outer end 15c to inner end 15a in predetermined winding direction D10 about predetermined region R1000 when viewed from above. Coil conductor 16 is disposed on upper surface 111c of insulating layer 11c, and extends spirally from inner end 16a to outer end 16c in predetermined winding direction D10 about predetermined region R1000 when viewed from above. Coil conductor 17 is disposed on upper surface 111b of insulating layer 11b and faces coil conductor 15 across insulating layer 11b substantially in up-down direction D1 so as to be magnetically coupled to coil conductor 15. Coil conductor 17 extends spirally from outer end 17c to inner end 17a in predetermined winding direction D10 about predetermined region R1000 when viewed from above. Coil conductor 18 is disposed on upper surface 111d of insulating layer 11d and faces coil conductor 16 across insulating layer 11d substantially in up-down direction D1 so as to be magnetically coupled to coil conductor 16. Coil conductor 18 extends spirally from inner end 18a to outer end 18c in predetermined winding direction D10 about predetermined region R1000 when viewed from above. Via-electrode 19 passes through at least one of insulating layers 11a to 11d, thereby connecting coil conductor 15 to coil conductor 16. Via-electrode 20 passes through at least one of insulating layers 11a to 11d, thereby connecting coil conductor 17 to coil conductor 18. Connection part 15b connects inner end 15a of coil conductor 15 to via-electrode 19. Connection part 16b connects inner end 16a of coil conductor 16 to via-electrode 19. Connection part 17b connects inner end 17a of coil conductor 17 to via-electrode 20. Connection part 18b connects inner end 18a of coil conductor 18 to via-electrode 20.

Figure 4:
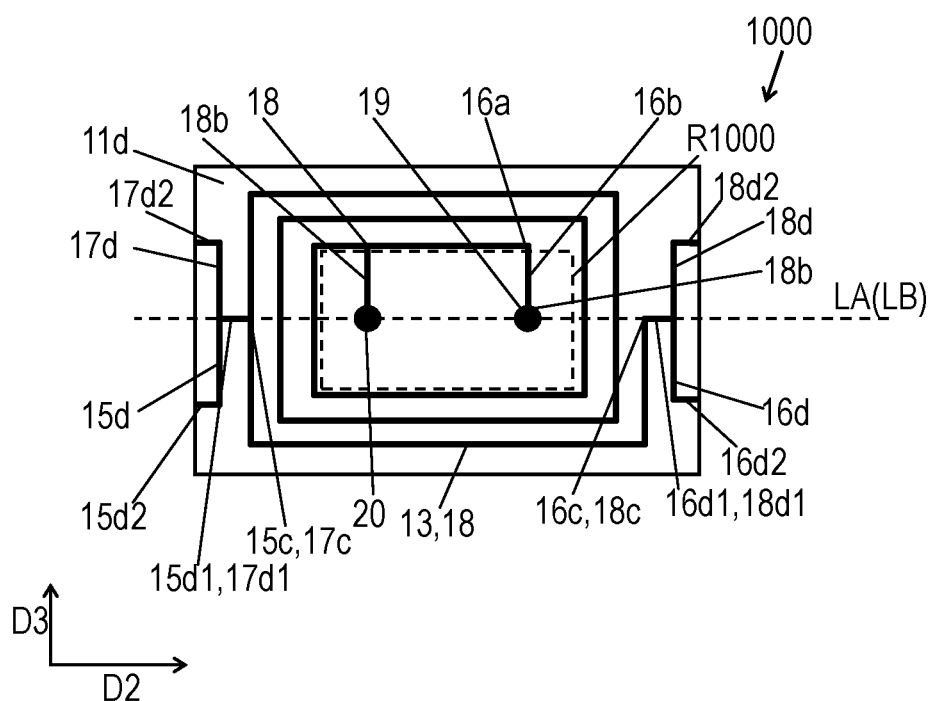
FIG. 4 is a top view of a main part of the common mode noise filter according to the embodiment.

Coil conductors 15 to 18 will be detailed below. FIG. 3 is a top view of insulating layers 11a to 11d for illustrating the arrangement of coil conductors 15 to 18 and lead parts 15d to 18d. FIG. 4 is a top view of common mode noise filter 1000 for illustrating the arrangement of coil conductors 15 to 18.

Connection part 15b overlaps connection part 16b when viewed from above. Connection part 17b overlaps connection part 18b when viewed from above. Inner end 15a of coil conductor 15 overlaps inner end 16a of coil conductor 16 when viewed from above. Inner end 17a of coil conductor 17 overlaps inner end 18a of coil conductor 18 when viewed from above. Outer end 15c of coil conductor 15 overlaps outer end 17c of coil conductor 17 when viewed from above. Outer end 16c of coil conductor 16 overlaps outer end 18c of coil conductor 18 when viewed from above.

Via-electrodes 19 and 20 are arranged substantially in long-side direction D2 of laminated body 14 when viewed from above, and also substantially in parallel with portions of coil conductors 15 to 18 which extend linearly in long-side direction D2. This arrangement increases the distance between via-electrodes 19 and 20, thereby reducing stray capacitance between them. In addition, this configuration increases the number of portions of the coil conductors arranged in short-side direction D3, that is, the number of portions of the coil conductors which extend in long-side direction D2. This configuration increases the number of turns of each of these coils, accordingly increasing inductance for common mode noises, and eliminating noises.

Via-electrodes 19 and 20 are arranged, when viewed from above, along straight line LA that extends in long-side direction D2. Connection parts 15b, 16b, 17b, and 18b are located on the same side with respect to straight line LA when viewed from above. That is, both inner end 15a of coil conductor 15 and inner end 16a of coil conductor 16 are located on the same side with respect to straight line LA when viewed from above. Both inner end 17a of coil conductor 17 and inner end 18a of coil conductor 18 are located on the same side with respect to straight line LA when viewed from above. In common mode noise filter 1000 according to the embodiment, inner end 15a of coil conductor 15, inner end 16a of coil conductor 16, inner end 17a of coil conductor 17, and inner end 18a of coil conductor 18 are located on the same side with respect to straight line LA when viewed from above. In this configuration, none of coil conductors 15 to 18 are located, when viewed from above, between straight line LA and each of the innermost portions of coil conductors 15 to 18 on the side on which connection parts 15b, 16b, 17b, and 18b are absent.

Each of coil conductors 15 to 18 includes a pad having a locally larger width and is connected to either via-electrode 19 or 20. In the description, however, explanations of the pad-portions are omitted.

Mobile terminals have recently demanded improved common mode noise filters as well as mounting components with small sizes. Such improved common mode noise filters are expected to have a small loss in cases where differential signals are transferred in high frequencies. This is because the mobile terminals are required to transmit data at higher speeds so as to process a large amount of data supplied from devices, such as a high-resolution camera. For example, in universal serial bus (USB) interfaces, USB 3.0 supports a data transmission speed of 5 Gbps, while USB 3.1 for superfast transmission supports a data transmission speed of 10 Gbps. Fundamental frequencies for such high-speed digital data have been increased from 2.5 GHz of USB 3.0 to 5 GHz of USB 3.1. Consequently, in consideration of nth-order harmonic frequency components as well that configure actual digital data, it is required for USB 3.1 to reduce a loss at frequencies ranging from about 5 GHz to about 15 GHz.

In conventional common mode noise filter 500, an electric current which has flowed from connection part 4c into via-electrode 5 flows through connection part 4d in a direction different from the direction in which the current flows connection part 4c, and further flows along the spiral shape. That is, the winding-end portion of coil conductor 4a is disposed at a position different from the winding-start portion of coil conductor 4b when viewed from above. Similarly, the winding-end portion of coil conductor 6a is disposed at a position different from the winding-start portion of coil conductor 6b.

Moreover, via-electrode 5 is located at a position different from via-electrode 7 when viewed from above. Therefore, in the vicinity of via-electrode 5, the winding-end portion of coil conductor 4a is located at a position different from the winding-start portion of coil conductor 4b. In the vicinity of via-electrode 7, the winding-end portion of coil conductor 6a is located at a position different from the winding-start portion of coil conductor 6b.

As a result, the length of the one innermost turn of coil 2 is different from the length of the one innermost turn of coil 3. This configuration causes coil 2 to be different in length from coil 3.

Specifically, in FIG. 8, coil conductor 4a has about three (3) turns and coil conductor 4b has about 2.5 turns while both the coil conductors constitute coil 2. Coil conductor 6a has about 3.5 turns and coil conductor 6b has about three (3) turns while both the coil conductors constitute coil 3. Therefore, coil 2 has about 5.5 turns and coil 3 has about 6.5 turns.

As a result, in cases where high-speed differential signals containing a large amount of high-frequency components passes through common mode noise filter 500, it results in an increase in loss. This is because a shift of signal timing results from the difference in length between coil 2 with about 5.5 turns and coil 3 with about 6.5 turns. This is also because, although coils 2 and 3 are magnetically coupled to each other as a whole, coils 2 and 3 still have portions which are not magnetically coupled to each other due to the difference in length between them. In particular, with increasing speed of the signals, frequency components which configure the high-speed signal shift to higher frequencies. This causes corresponding wavelengths to shift to shorter wavelengths. Consequently, the ratio of the difference in length between coils 2 and 3 to the wavelength increases. This increase tends to increase the influence of the difference on the high-speed signals, which results in an increase in loss, causing the common mode filter to be hardly used in high frequencies.

In common mode noise filter 1000 according to the embodiment, as described above, connection part 15b which connects inner end 15a of coil conductor 15 to via-electrode 19 overlaps, when viewed from above, connection part 16b which connects inner end 16a of coil conductor 16 to via-electrode 19. Connection part 17b which connects inner end 17a of coil conductor 17 to via-electrode 20 overlaps, when viewed from above, connection part 18b which connects inner end 18a of coil conductor 18 to via-electrode 20. In this configuration, inner end 15a which is the winding-end portion of coil conductor 15 is located at the same position as inner end 16a which is the winding-start portion of coil conductor 16 when viewed from above. Inner end 17a which is the winding-end portion of coil conductor 17 is located at the same position as inner end 18a which is the winding-start portion of coil conductor 18 when viewed from above. With this configuration, the one innermost turn of coil 12 overlaps the one innermost turn of coil 13, when viewed from above, which causes coil 12 to have approximately the same length as coil 13. That is, as shown in FIG. 3, coil conductor 15 has the length of about 2.5 turns and coil conductor 16 has the length of about three (3) turns while both the coil conductors constitute coil 12. Coil conductor 17 has the length of about three (3) turns and coil conductor 18 has the length of about 2.5 turns while both the coil conductors constitute coil 13. Coil 12 and coil 13 thus have substantially the same length of about 5.5 turns. As a result, even in cases where a high-speed differential signals with a high frequency passes through, common mode noise filter 1000 eliminates shifts in timing of the differential signals and eliminates portions of coils 12 and 13 which are not magnetically coupled to each other, hence allowing common mode noise filter 1000 to be used in high frequencies.

Two coil conductors 16 and 18 out four coil conductors 15 to 18 are disposed on the upper side in up-down direction D1, the laminating direction. Coil conductors 16 and 18 have a total length of about 5.5 turns. Two coil conductors 15 and 17 out coil conductors 16 and 18 are disposed on the lower side. Coil conductors 15 and 17 have a total length of about 5.5 turns which is equal to that of coil conductors 16 and 18. In up-down direction D1, each of coil conductors 16 and 17 located in an inside portion has about three (3) turns while each of coil conductors 15 and 18 located on the outsides has about 2.5 turns. Coil conductors 15 to 18 thus have preferable symmetry.

In cases where differential signals with a high frequency is input to coils 12 and 13, coil conductor 15 having the length of about 2.5 turns is magnetically coupled to coil conductor 17 having the length of about three (3) turns, thereby constituting common mode filter unit 1000a. Coil conductor 16 having the length of about three (3) turns is magnetically coupled to coil conductor 18 having the length of about 2.5 turns, thereby constituting common mode filter unit 1000b. Coil 12 including coil conductors 15 and 16 connected in series to each other has substantially the same length as coil 13 including coil conductors 17 and 18 connected in series to each other. The number of turns of coil conductor 15 is substantially equal to the number of turns of coil conductor 17 that constitutes common mode filter unit 1000a together with coil conductor 15. The number of turns of coil conductor 16 is substantially equal to the number of turns of coil conductor 18 that constitutes common mode filter unit 1000b together with coil conductor 16. Since the length of coil 12 is substantially equal to the length of coil 13, the difference in characteristics is small between two cases: one case where differential signals with a high frequency are input from common mode filter unit 1000a, and the other case where the differential signals are input from common mode filter unit 1000b.

In conventional common mode noise filter 500 shown in FIG. 8, coil conductor 4a having about three (3) turns and coil conductor 6a having about 3.5 turns constitute a first common mode filter unit. Coil conductor 4b having about 2.5 turns and coil conductor 6b having about three (3) turns constitute a second common mode filter unit. The second common mode filter unit has a larger number of turns than the first common mode filter unit because of the combination of the coil conductors which each have larger number of turns. In addition, the difference in coil length between coil 2 and coil 3 is about one turn. This difference causes a difference in characteristics, depending on from which of the first and second common mode filter units a differential signals with a high frequency are input.

FIG. 4 is a top view of a main part of common mode noise filter 1000 for illustrating the arrangement of coil conductors 15 to 18 shown in FIG. 3 when viewed from above. In common mode noise filter 1000 according to the embodiment, four coil conductors 15 to 18 overlap one another when viewed from above. Coils 12 and 13 may be densely wound the same number of turns, approximately about 5.5 turns in the same region when viewed from above. In this arrangement, each of coils 12 and 13 (coil conductors 15 to 18) can be densely wound from the inner end. This reduces the areas of coil conductors 15 to 18, when viewed from above, which face one another in up-down direction D1, thereby reducing undesired stray capacitance among the coil conductors.

In contrast, in conventional common mode noise filter 500 shown in FIG. 8, the areas of coil conductors 4a and 6a are larger than the areas of coil conductors 4b and 6b when viewed from above, resulting in an increase in undesired stray capacitance among the coil conductors. Consequently, upon having differential signals with a high frequency are inputted, a loss in the common mode noise filter becomes large. This may hardly maintain the quality of signals.

In common mode noise filter 1000 according to the embodiment shown in FIGS. 3 and 4, a current having flowed from external electrode 21a into coil conductor 15 flows into coil conductor 16 via inner end 15a, connection part 15b, and via-electrode 19. In this case, the current flows through connection part 16b, which is the winding-start portion of coil conductor 16, in a direction opposite to the direction in which the current has flowed through connection part 15b, which is the winding-end portion of coil conductor 15. Then, the current reaches inner end 16a of coil conductor 16. Inner end 15a of coil conductor 15 substantially overlaps inner end 16a of coil conductor 16 when viewed from above. The current thus flows into coil conductor 16 from inner end 16a located at the same position as inner end 15a when viewed from above. The direction of the current flowing through coil conductor 16 is the same as that of the current having flowed through coil conductor 15. As a result, the current flows through just one round of the innermost portion of coil 12 about region R1000 without excess and deficiency when viewed from above.

Similarly, the current that flows through coil 13 including coil conductors 17 and 18 flows through just one round of the innermost portion of coil 13 about region R1000 without excess and deficiency when viewed from above. The one innermost turn of coil 12 overlaps the one innermost turn of coil 13 when viewed from above. Therefore, the length of coil 12 is equal to the length of coil 13.

Therefore, the lengths of all connection parts 15b to 18b is equal to each other, thereby causing the length of coil 12 to be more accurately equal to the length of coil 13.

Via-electrodes 19 and 20 are located, when viewed from above, along straight line LA that extends in long-side direction D2 of laminated body 14. Via-electrodes 19 and 20 are disposed along straight line LA in such that the straight line passes through a center of laminated body 14, i.e. coil conductors 15 to 18 short-side direction D3. This configuration allows coil conductors 15 to 18 to be disposed evenly and symmetrically in short-side direction D3.

Outer ends 15c, 16c, 17c, and 18c are located along straight line LA which extends in the long-side direction and passes, when viewed from above, through the center of laminated body 14 in short-side direction D3, i.e. the centers of coil conductors 15 to 18 in short-side direction D3. Coil conductors 15 and 17 which overlap each other when viewed from above include portions 15d1 and 17d1 which extend from outer ends 15c and 17c to lead parts 15d and 17d, respectively. Portion 15d1 of coil conductor 15 overlaps portion 17d1 of coil conductor 17 when viewed from above. The length of portion 15d2 of lead part 15d which is connected from external electrode 21a to portions 15d1 of lead part 15d is equal to the length of portion 17d2 of lead part 17d which is connected from external electrode 21c to portion 17d1 of lead part 17d. Similarly, coil conductors 16 and 18 overlap each other when viewed from above. Portion 16d1 of lead part 16d which extends from outer end 16c to lead parts 16d overlaps portion 18d1 of to lead part 18d which extend from outer end 18c to lead part 18d when viewed from above. The length of portion 16d2 of lead part 16d which is connected from external electrode 21b to portion 16d1 of lead part 16d is equal in the length of portion 18d2 of lead part 18d which is connected from external electrode 21d to portion 18d1 of lead part 18d.

In this configuration, the lengths of lead parts 15d to 18d equal to each other, thereby causing coil 12 to be substantially equal in length to coil 13 in the vicinity of external electrodes 21a to 21d. This configuration allows the total length of coil 12 to be equal accurately to the total length of coil 13.

Outer ends 15c, 16c, 17c, and 18c and via-electrodes 19 and 20 may be arranged along straight line LA.

Coil conductor 15 includes innermost portion 15e that faces inner end 15a across region R1000 in short-side direction D3 when viewed from above. Coil conductor 16 includes innermost portion 16e that faces inner end 16a across region R1000 in short-side direction D3 when viewed from above. Coil conductor 17 includes innermost portion 17e that faces inner end 17a across region R1000 in short-side direction D3 when viewed from above. Coil conductor 18 includes innermost portion 18e that faces inner end 18a across region R1000 in short-side direction D3 when viewed from above. As shown in FIG. 3, when viewed from above, inner ends 15a to 18a of coil conductors 15 to 18 is located away by distance W from innermost portions 15e to 18e of coil conductors 15 to 18, respectively. When viewed from above, straight line LA along which via-electrodes 19 and 20 are arranged is located at the middle of the distance between each of inner ends 15a to 18a of coil conductors 15 to 18 and respective one of innermost portions 15e to 18e of coil conductors 15 to 18. This configuration locates via-electrodes 19 and 20 farthest away from coil conductors 15 to 18, accordingly decreasing stray capacitance between via-electrodes 19 and 20 and coil conductors 15 to 18.

Connection parts 15b, 16b, 17b, and 18b extend in a direction substantially perpendicular to long-side direction D2 of laminated body 14. This configuration allows connection parts 15b, 16b, 17b, and 18b to be located away by a constant distance from the other connection parts and from the coil conductors.

Figure 5:
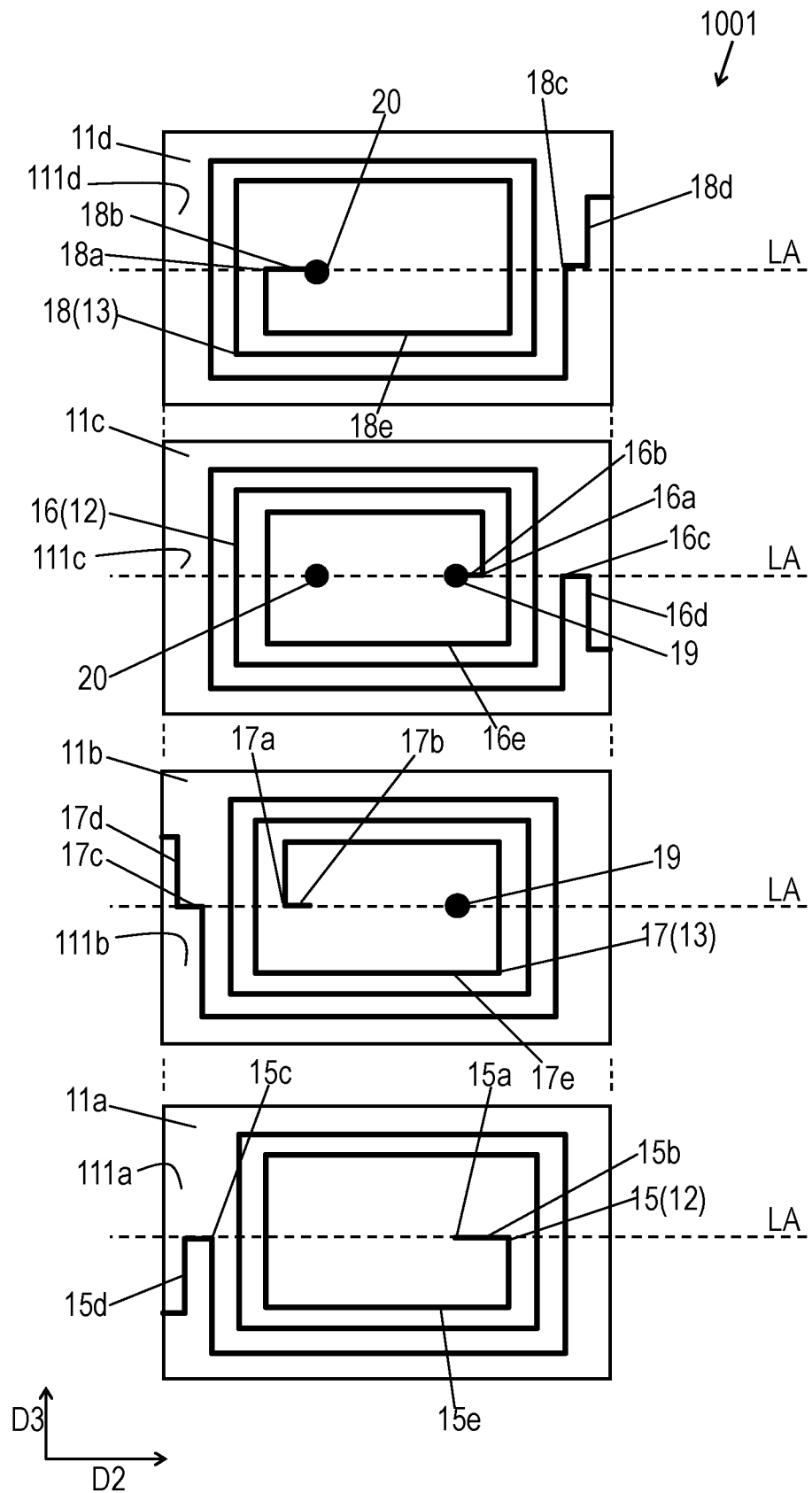
FIG. 5 is a top view of insulating layers of another common mode noise filter according to the embodiment.

FIG. 5 is a top view of insulating layers 11a to 11d of another common mode noise filter 1001 according to the embodiment. In FIG. 5, components identical to those of common mode noise filter 1000 shown in FIG. 3 are denoted by the same reference numerals. In common mode noise filter 1000 shown in FIG. 3, connection parts 15b, 16b, 17b, and 18b extend in the direction substantially perpendicular to long-side direction D2 of laminated body 14. In contrast, in common mode noise filter 1001 shown in FIG. 5, connection parts 15b, 16b, 17b, and 18b extend in long-side direction D2. Straight line LA along which electrodes 19 and 20 are arranged crosses the innermost portion of coil conductor 15 at inner end 15a of coil conductor 15. Straight line LA crosses the innermost portion of coil conductor 16 at inner end 16a of coil conductor 16. Straight line LA crosses the innermost portion of coil conductor 17 at inner end 17a of coil conductor 17. Straight line LA crosses the innermost portion of coil conductor 18 at inner end 18a of coil conductor 18. Connection part 15b connects inner end 15a of coil conductor 15 to via-electrode 19. Connection part 16b connects inner end 16a of coil conductor 16 to via-electrode 19. Connection part 17b connects inner end 17a of coil conductor 17 to via-electrode 20. Connection part 18b connects inner end 18a of coil conductor 18 to via-electrode 20. This configuration decreases portions of connection parts 15b and 16b which overlap each other when viewed from above, and decreases undesired stray capacitance between connection parts 15b and 16b. This configuration also decreases portions of connection parts 17b and 18b which overlap each other when viewed from above, accordingly decreasing undesired stray capacitance between connection parts 17b and 18b. As a result, the configuration allows a decrease in change in characteristics at high frequencies.

In common mode noise filter 1001, connection parts 15b, 16b, 17b, and 18b, outer ends 15c, 16c, 17c, and 18c, and via-electrodes 19 and 20 may be arranged along straight line LA.

Figure 6:
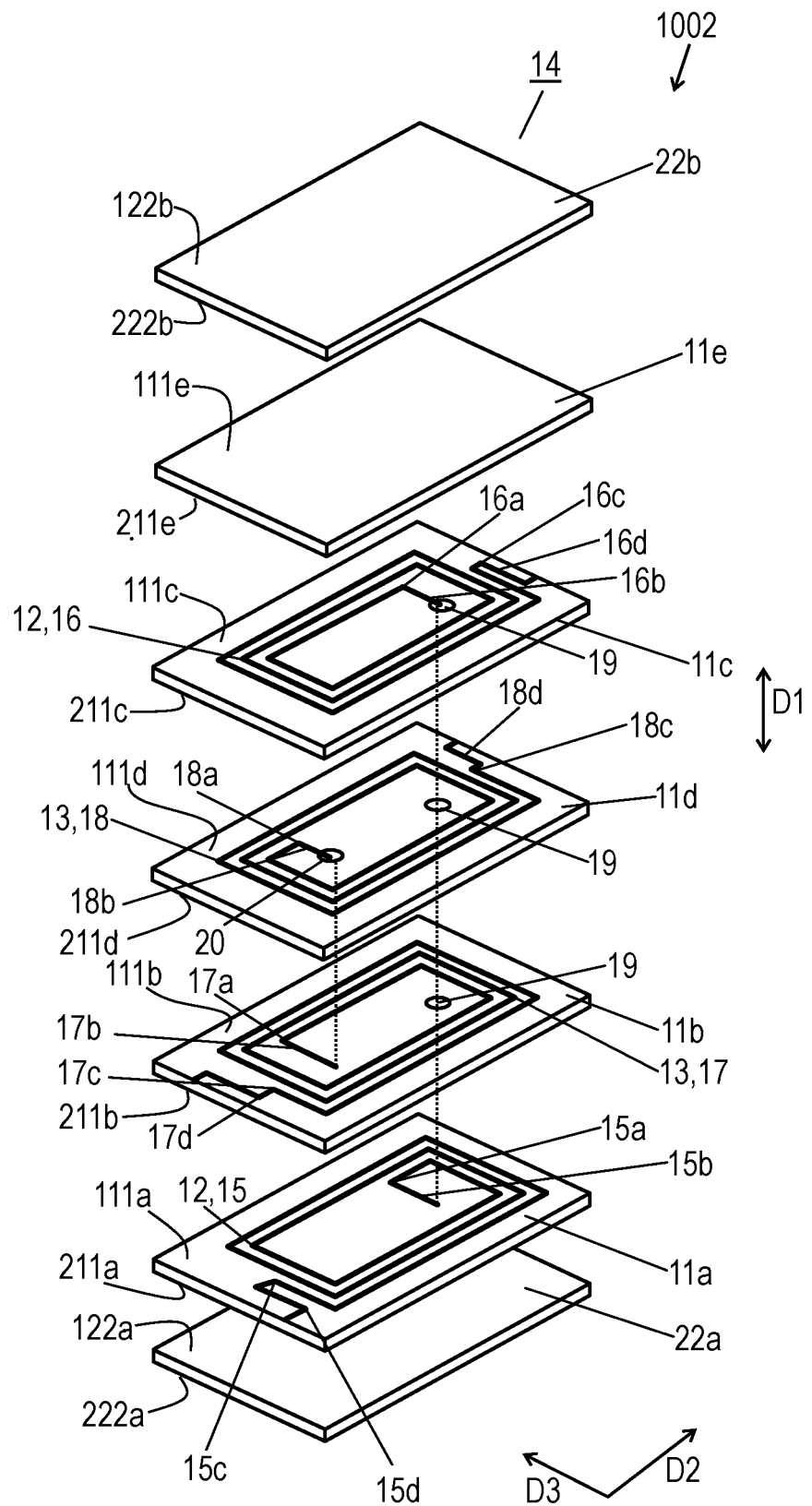
FIG. 6 is an exploded perspective view of still another common mode noise filter according to the embodiment.
Figure 7:
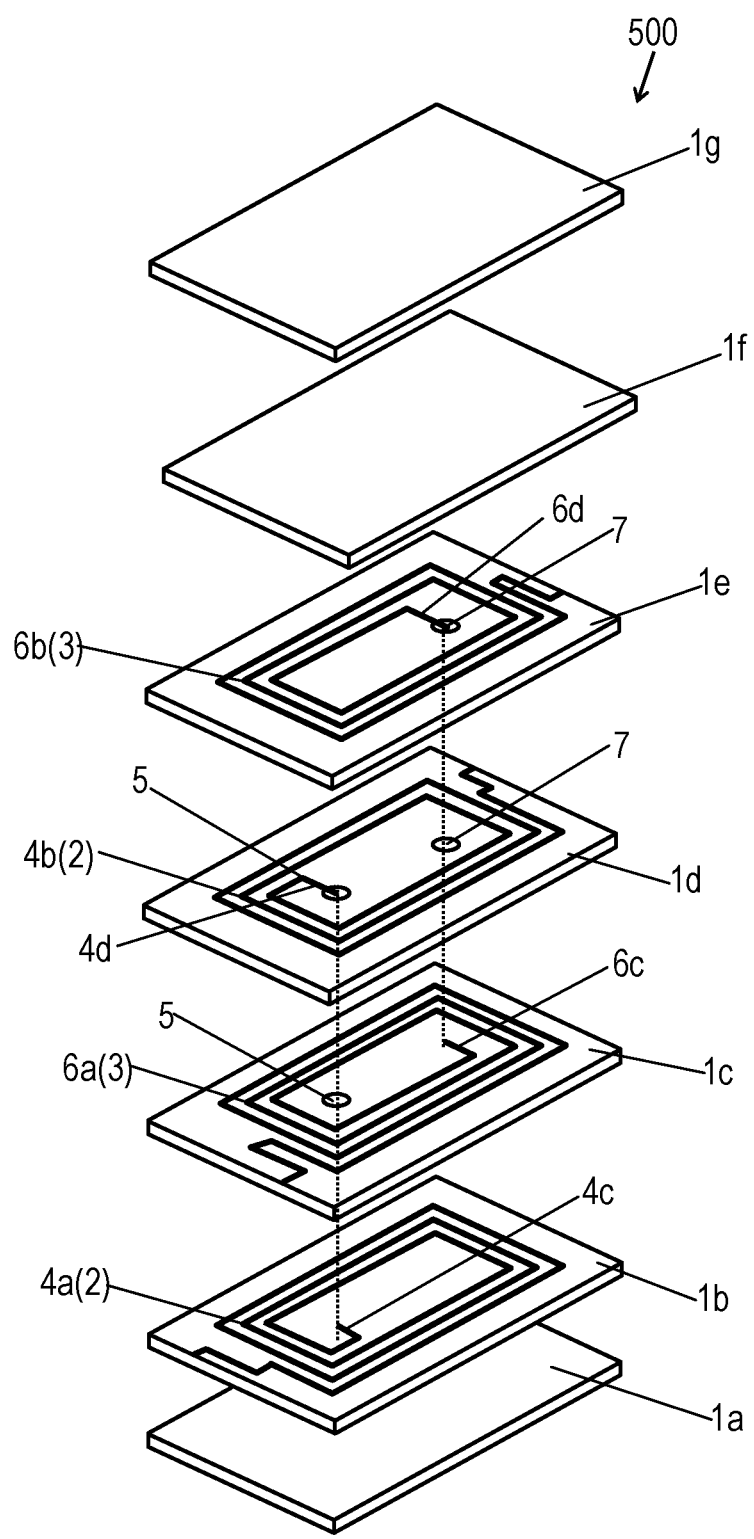
FIG. 7 is an exploded perspective view of a conventional common mode noise filter.

FIG. 6 is an exploded perspective view of still another common mode noise filter 1002 according to the embodiment. In FIG. 6, components identical to those of common mode noise filter 1000 shown in FIG. 2A are denoted by the same reference numerals. In common mode noise filter 1000 shown in FIG. 2A, coil conductors 15 and 16 constituting coil 12 are arranged alternately with coil conductors 17 and 18 constituting coil 13 in up-down direction D1. In common mode noise filter 1002 shown in FIG. 6, both of coil conductors 17 and 18 constituting coil 13 are arranged between coil conductors 15 and 16 constituting coil 12 in up-down direction D1.

That is, in common mode noise filter 1002 shown in FIG. 6, lower surface 211a of insulating layer 11a is situated on upper surfaces 122a of insulating layer 22a. Lower surface 211b of insulating layer 11b is situated on upper surfaces 111a of insulating layer 11a. Lower surface 211d of insulating layer 11d is situated on upper surfaces 111b of insulating layer 11b. Lower surface 211c of insulating layer 11c is situated on upper surfaces 111d of insulating layer 11d. Lower surface 211e of insulating layer 11e is situated on upper surfaces 11c of insulating layer 11c. Lower surface 222b of insulating layer 22b is situated on upper surfaces 111e of insulating layer 11e. Coil conductor 15 disposed on upper surface 111a of insulating layer 11a is located on lower surface 211b of insulating layer 11b. Coil conductor 17 disposed on upper surface 111b of insulating layer 11b is located on lower surface 211d of insulating layer 11d. Coil conductor 18 disposed on upper surface 111d of insulating layer 11d is located on lower surface 211c of insulating layer 11c. Coil conductor 16 disposed on upper surface 111c of insulating layer 11c is located on lower surface 2111e of insulating layer 11e.

In common mode noise filter 1002, coil conductor 18 is thus disposed on upper surface 111d of insulating layer 11d and faces coil conductor 16 via across insulating layer 11c substantially in up-down direction D1 so as to be magnetically coupled to coil conductor 16. That is, in common mode noise filters 1000 to 1002 according to the embodiment, coil conductor 18 is disposed on upper surface 111d of insulating layer 11d and faces coil conductor 16 via one of insulating layers 11c and 11d substantially in up-down direction D1 so as to be magnetically coupled to coil conductor 16.

In common mode noise filters 1000 and 1002 shown in FIGS. 2A, 3, and 6, coil conductors 15 to 18 may be disposed such that coil conductors 15 and 17 are replaced with each other while coil conductors 16 and 18 are replaced with each other.

In the common mode noise filters described above, as shown in FIG. 1, external electrodes 21a and 21c are disposed on edge surface 314 that is the short side of laminated body 14 while external electrodes 21b and 21d are disposed on edge surface 414 that is the side of the laminated body opposite to edge surface 314. This configuration decreases stray capacitance between each of external electrodes 21a and 21c and respective one of external electrodes 21b and 21d.

In the common mode noise filters described above, the direction in which external electrodes 21a and 21b are arranged, the direction in which external electrodes 21c and 21d are arranged, and the direction in which via-electrodes 19 and 20 are arranged are substantially identical to long-side direction D2 of laminated body 14.

In the above embodiments, terms, such as "upper surface", "lower surface", "above", and "up-down", indicating directions merely indicate relative directions depending only on the relative positional relationship of constituent components, such as the insulating layers and the coil conductors, of the common mode noise filters, and do not indicate absolute directions, such as a vertical direction.

INDUSTRIAL APPLICABILITY

A common mode noise filters according to the present invention can be used in high frequencies, and particularly, are useful as a small common mode noise filter with a low profile that is used, as a countermeasure against noises, in a wide range of electronic equipment including digital equipment, audiovisual equipment, and information communication terminals.

REFERENCE MARKS IN THE DRAWINGS 11a insulating layer (first insulating layer)
11b insulating layer (third insulating layer)
11c insulating layer (second insulating layer)
11d insulating layer (fourth insulating layer)
12 coil (first coil)
13 coil (second coil)
14 laminated body
15 coil conductor (first coil conductor)
15a inner end (first inner end)
15b connection part (first connection part)
15c outer end (first outer end)
16 coil conductor (second coil conductor)
16a inner end (second inner end)
16b connection part (second connection part)
16c outer end (second outer end)
17 coil conductor (third coil conductor)
17a inner end (third inner end)
17b connection part (third connection part)
17c outer end (third outer end)
18 coil conductor (fourth coil conductor)
18a inner end (fourth inner end)
18b connection part (fourth connection part)
18c outer end (fourth outer end)
19 via-electrode (first via-electrode)
20 via-electrode (second via-electrode)

The invention claimed is:

1. A common mode noise filter, comprising:
a laminated body including a first insulating layer, a second insulating layer, a third insulating layer, and a fourth insulating layer which are stacked on one another in an up-down direction;
a first coil including:
a first coil conductor disposed on an upper surface of the first insulating layer, the first coil conductor having a first outer end and a first inner end, the first coil conductor extending from the first outer end to the first inner end spirally about a predetermined region in a predetermined winding direction when viewed from above, and
a second coil conductor disposed on an upper surface of the second insulating layer, the second coil conductor having a second outer end and a second inner end, the second coil conductor extending from the second inner end to the second outer end spirally about the predetermined region in the predetermined winding direction when viewed from above;
a second coil including:
a third coil conductor disposed on an upper surface of the third insulating layer, the third coil conductor having a third outer end and a third inner end, the third coil conductor extending from the third outer end to the third inner end spirally about the predetermined region in the predetermined winding direction when viewed from above, the third coil conductor facing the first coil conductor across the third insulating layer substantially in the up-down direction so as to be magnetically coupled to the first coil conductor, and
a fourth coil conductor disposed on an upper surface of the fourth insulating layer, the fourth coil conductor having a fourth outer end and a fourth inner end, the fourth coil conductor extending from the fourth inner end to the fourth outer end spirally about the predetermined region in the predetermined winding direction when viewed from above, the fourth coil conductor facing the second coil conductor across one of the second and fourth insulating layers substantially in the up-down direction so as to be magnetically coupled to the second coil conductor;
a first via-electrode passing through at least one of the first, second, third, and fourth insulating layers so as to connect the first coil conductor to the second coil conductor;
a second via-electrode passing through at least one of the first, second, third, and fourth insulating layers so as to connect the third coil conductor to the fourth coil conductor;
a first connection part connecting the first via-electrode to the first inner end of the first coil conductor,
a second connection part connecting the first via-electrode to the second inner end of the second coil conductor;
a third connection part connecting the second via-electrode to the third inner end of the third coil conductor; and
a fourth connection part connecting the second via-electrode to the fourth inner end of the fourth coil conductor,
wherein the first connection part overlaps the second connection part when viewed from above,
wherein the third connection part overlaps the fourth connection part when viewed from above, and
wherein the laminated body has a rectangular parallelepiped shape having a rectangular shape when viewed from above, the rectangular shape having long sides which extend in a long-side direction and short sides which extend in a short-side direction perpendicular to the long-side direction and are shorter than the long sides, and
wherein the first outer end of the first coil conductor, the second outer end of the second coil conductor, the third outer end of the third coil conductor, and the fourth outer end of the fourth coil conductor are disposed along a straight line when viewed from above, the straight line passing through a center of the laminated body in the short-side direction.

2. The common mode noise filter according to claim 1, wherein the first via-electrode and the second via-electrode are arranged along a straight line when viewed from above, the straight line extending substantially in the long-side direction.

3. The common mode noise filter according to claim 2, wherein the straight line along which the first via-electrode and the second via-electrode are arranged passes through the center of the laminated body in the short-side direction when viewed from above.

4. The common mode noise filter according to claim 3, wherein the straight line along which the first via-electrode and the second via-electrode are arranged passes, when viewed from above, through a middle between the first inner end of the first coil conductor and an innermost portion of the first coil conductor facing the first inner end of the first coil conductor across the predetermined region, wherein the straight line along which the first via-electrode and the second via-electrode are arranged passes, when viewed from above, through a middle between the second inner end of the second coil conductor and an innermost portion of the second coil conductor facing the second inner end of the second coil conductor across the predetermined region, wherein the straight line along which the first via-electrode and the second via-electrode are arranged passes, when viewed from above, through a middle between the third inner end of the third coil conductor and an innermost portion of the third coil conductor facing the third inner end of the third coil conductor across the predetermined region, and wherein the straight line along which the first via-electrode and the second via-electrode are arranged passes, when viewed from above, through a middle between the fourth inner end of the fourth coil conductor and an innermost portion of the fourth coil conductor facing the fourth inner end of the fourth coil conductor across the predetermined region.

5. The common mode noise filter according to claim 1,
wherein the first connection part is disposed on the upper surface of the first insulating layer,
wherein the second connection part is disposed on the upper surface of the second insulating layer,
wherein the third connection part is disposed on the upper surface of the third insulating layer, and
wherein the fourth connection part is disposed on the upper surface of the fourth insulating layer.

6. The common mode noise filter according to claim 1,
wherein the first connection part, the second connection part, the third connection part, and the fourth connection part extend substantially perpendicularly to the long-side direction.

7. The common mode noise filter according to claim 1, wherein the first connection part, the second connection part, the third connection part, and the fourth connection part have substantially an identical length.

8. The common mode noise filter according to claim 1,
wherein the first coil conductor has an outer border having a rectangular shape having long sides which extend in the long-side direction and short sides which extend in the short-side direction perpendicular to the long-side direction and are shorter than the long sides when viewed from above, and
wherein the first, second, third, and fourth connection parts extend substantially perpendicularly to the long-side direction.

9. The common mode noise filter according to claim 8,
wherein the first and second via-electrodes are arranged substantially along a straight line extending in the long-side direction,
wherein the first inner end of the first coil conductor and the second inner end of the second coil conductor are located on a same side with respect to the straight line extending in the long-side direction when viewed from above, and
wherein the third inner end of the third coil conductor and the fourth inner end of the fourth coil conductor are located on a same side with respect to the straight line extending in the long-side direction when viewed from above.

10. The common mode noise filter according to claim 1,
wherein the first coil conductor has an outer border having a rectangular shape having long B sides which extend in the long-side direction and short sides which extend in the short-side direction perpendicular to the long-side direction and are shorter than the long sides when viewed from above, and
wherein the first via-electrode and the second via-electrode are arranged substantially along a straight line when viewed from above, the straight line extending substantially in the long-side direction.

11. The common mode noise filter according to claim 10, wherein the straight line along which the first via-electrode and the second via-electrode are arranged passes, when viewed from above, through a center of the first coil conductor in the short-side direction.

12. The common mode noise filter according to claim 1,
wherein the first coil conductor has an outer border having a rectangular shape having long sides which extend in the long-side direction and short sides which extend in the short-side direction perpendicular to the long-side direction and are shorter than the long sides, when viewed from above, and
wherein the first outer end of the first coil conductor, the second outer end of the second coil conductor, the third outer end of the third coil conductor, and the fourth outer end of the fourth coil conductor are disposed along a straight line passing through a center of the first coil conductor in the short-side direction when viewed from above.

13. A common mode noise filter, comprising:
a laminated body including a first insulating layer, a second insulating layer, a third insulating layer, and a fourth insulating layer which are stacked on one another in an up-down direction;
a first coil including:
a first coil conductor disposed on an upper surface of the first insulating layer, the first coil conductor having a first outer end and a first inner end, the first coil conductor extending from the first outer end to the first inner end spirally about a predetermined region in a predetermined winding direction when viewed from above, and
a second coil conductor disposed on an upper surface of the second insulating layer, the second coil conductor having a second outer end and a second inner end, the second coil conductor extending from the second inner end to the second outer end spirally about the predetermined region in the predetermined winding direction when viewed from above;
a second coil including:
a third coil conductor disposed on an upper surface of the third insulating layer, the third coil conductor having a third outer end and a third inner end, the third coil conductor extending from the third outer end to the third inner end spirally about the predetermined region in the predetermined winding direction when viewed from above, the third coil conductor facing the first coil conductor across the third insulating layer substantially in the up-down direction so as to be magnetically coupled to the first coil conductor, and
a fourth coil conductor disposed on an upper surface of the fourth insulating layer, the fourth coil conductor having a fourth outer end and a fourth inner end, the fourth coil conductor extending from the fourth inner end to the fourth outer end spirally about the predetermined region in the predetermined winding direction when viewed from above, the fourth coil conductor facing the second coil conductor across one of the second and fourth insulating layers substantially in the up-down direction so as to be magnetically coupled to the second coil conductor;

a first via-electrode passing through at least one of the first, second, third, and fourth insulating layers so as to connect the first coil conductor to the second coil conductor;

a second via-electrode passing through at least one of the first, second, third, and fourth insulating layers so as to connect the third coil conductor to the fourth coil conductor;

a first connection part connecting the first via-electrode to the first inner end of the first coil conductor;

a second connection part connecting the first via-electrode to the second inner end of the second coil conductor;

a third connection part connecting the second via-electrode to the third inner end of the third coil conductor; and a fourth connection part connecting the second via-electrode to the fourth inner end of the fourth coil conductor, wherein the first connection part overlaps the second connection part when viewed from above, wherein the third connection part overlaps the fourth connection part when viewed from above, wherein the laminated body has a rectangular parallelepiped shape having a rectangular shape when viewed from above, the rectangular shape having long sides which extend in a long-side direction and short sides which extend in a short-side direction perpendicular to the long-side direction and are shorter than the long sides, and wherein the first connection part, the second connection part, the third connection part, and the fourth connection part extend substantially perpendicularly to the long-side direction.

14. The common mode noise filter according to claim 13, wherein the first coil conductor has an outer border having a rectangular shape having long sides which extend in the long-side direction and short sides which extend in the short-side direction perpendicular to the long-side direction and are shorter than the long sides when viewed from above.

15. The common mode noise filter according to claim 14, wherein the first and second via-electrodes are arranged substantially along a straight line extending in the long-side direction, wherein the first inner end of the first coil conductor and the second inner end of the second coil conductor are located on a same side with respect to the straight line when viewed from above, and wherein the third inner end of the third coil conductor and the fourth inner end of the fourth coil conductor are located on a same side with respect to the straight line when viewed from above.

16. The common mode noise filter according to claim 13, wherein the first connection part is disposed on the upper surface of the first insulating layer, wherein the second connection part is disposed on the upper surface of the second insulating layer, wherein the third connection part is disposed on the upper surface of the third insulating layer, and wherein the fourth connection part is disposed on the upper surface of the fourth insulating layer.

17. The common mode noise filter according to claim 13, wherein the first via-electrode and the second via-electrode are arranged along a straight line when viewed from above, the straight line extending substantially in the long-side direction.

18. The common mode noise filter according to claim 17, wherein the straight line along which the first via-electrode and the second via-electrode are arranged passes through a center of the laminated body in the short-side direction when viewed from above.

19. The common mode noise filter according to claim 18, wherein the straight line along which the first via-electrode and the second via-electrode are arranged passes, when viewed from above, through a middle between the first inner end of the first coil conductor and an innermost portion of the first coil conductor facing the first inner end of the first coil conductor across the predetermined region, wherein the straight line passes, when viewed from above, through a middle between the second inner end of the second coil conductor and an innermost portion of the second coil conductor facing the second inner end of the second coil conductor across the predetermined region, wherein the straight line passes, when viewed from above, through a middle between the third inner end of the third coil conductor and an innermost portion of the third coil conductor facing the third inner end of the third coil conductor across the predetermined region, and wherein the straight line passes, when viewed from above, through a middle between the fourth inner end of the fourth coil conductor and an innermost portion of the fourth coil conductor facing the fourth inner end of the fourth coil conductor across the predetermined region.

20. The common mode noise filter according to claim 13, wherein the first connection part, the second connection part, the third connection part, and the fourth connection part have substantially an identical length.

21. The common mode noise filter according to claim 13, wherein the first coil conductor has an outer border having a rectangular shape having long B sides which extend in the long-side direction and short sides which extend in the short-side direction perpendicular to the long-side direction and are shorter than the long sides when viewed from above, and wherein the first via-electrode and the second via-electrode are arranged substantially along a straight line when viewed from above, the straight line extending substantially in the long-side direction.

22. The common mode noise filter according to claim 21, wherein the straight line along which the first via-electrode and the second via-electrode are arranged passes, when viewed from above, through a center of the first coil conductor in the short-side direction.

23. The common mode noise filter according to claim 13, wherein the first coil conductor has an outer border having a rectangular shape having long sides which extend in the long-side direction and short sides which extend in the short-side direction perpendicular to the long-side direction and are shorter than the long sides, when viewed from above, and wherein the first outer end of the first coil conductor, the second outer end of the second coil conductor, the third outer end of the third coil conductor, and the fourth outer end of the fourth coil conductor are disposed along a straight line passing through a center of the first coil conductor in the short-side direction when viewed from above.

24. A common mode noise filter, comprising:
a laminated body including a first insulating layer, a second insulating layer, a third insulating layer, and a fourth insulating layer which are stacked on one another in an up-down direction;
a first coil including:
  a first coil conductor disposed on an upper surface of the first insulating layer, the first coil conductor having a first outer end and a first inner end, the first coil conductor extending from the first outer end to the first inner end spirally about a predetermined region in a predetermined winding direction when viewed from above, and
  a second coil conductor disposed on an upper surface of the second insulating layer, the second coil conductor having a second outer end and a second inner end, the second coil conductor extending from the second inner end to the second outer end spirally about the predetermined region in the predetermined winding direction when viewed from above;
a second coil including:
  a third coil conductor disposed on an upper surface of the third insulating layer, the third coil conductor having a third outer end and a third inner end, the third coil conductor extending from the third outer end to the third inner end spirally about the predetermined region in the predetermined winding direction when viewed from above, the third coil conductor facing the first coil conductor across the third insulating layer substantially in the up-down direction so as to be magnetically coupled to the first coil conductor, and
  a fourth coil conductor disposed on an upper surface of the fourth insulating layer, the fourth coil conductor having a fourth outer end and a fourth inner end, the fourth coil conductor extending from the fourth inner end to the fourth outer end spirally about the predetermined region in the predetermined winding direction when viewed from above, the fourth coil conductor facing the second coil conductor across one of the second and fourth insulating layers substantially in the up-down direction so as to be magnetically coupled to the second coil conductor;
a first via-electrode passing through at least one of the first, second, third, and fourth insulating layers so as to connect the first coil conductor to the second coil conductor;
a second via-electrode passing through at least one of the first, second, third, and fourth insulating layers so as to connect the third coil conductor to the fourth coil conductor;
a first connection part connecting the first via-electrode to the first inner end of the first coil conductor;
a second connection part connecting the first via-electrode to the second inner end of the second coil conductor;
a third connection part connecting the second via-electrode to the third inner end of the third coil conductor; and
a fourth connection part connecting the second via-electrode to the fourth inner end of the fourth coil conductor,
wherein the first connection part overlaps the second connection part when viewed from above,
wherein the third connection part overlaps the fourth connection part when viewed from above, wherein the first coil conductor has an outer border having a rectangular shape having long sides which extend in a long-side direction and short sides which extend in a short-side direction perpendicular to the long-side direction and are shorter than the long sides, when viewed from above, and wherein the first outer end of the first coil conductor, the second outer end of the second coil conductor, the third outer end of the third coil conductor, and the fourth outer end of the fourth coil conductor are disposed along a straight line passing through a center of the first coil conductor in the short-side direction when viewed from above.

25. The common mode noise filter according to claim 24, wherein the first, second, third, and fourth connection parts extend substantially perpendicularly to the long-side direction.

26. The common mode noise filter according to claim 25,
wherein the first and second via-electrodes are arranged substantially along a straight line extending in the long-side direction,
wherein the first inner end of the first coil conductor and the second inner end of the second coil conductor are located on a same side with respect to the straight line extending in the long-side direction when viewed from above, and
wherein the third inner end of the third coil conductor and the fourth inner end of the fourth coil conductor are located on a same side with respect to the straight line extending in the long-side direction when viewed from above.

27. The common mode noise filter according to claim 24,
wherein the first connection part is disposed on the upper surface of the first insulating layer,
wherein the second connection part is disposed on the upper surface of the second insulating layer,
wherein the third connection part is disposed on the upper surface of the third insulating layer, and
wherein the fourth connection part is disposed on the upper surface of the fourth insulating layer.

28. The common mode noise filter according to claim 24,
wherein the laminated body has a rectangular parallelepiped shape having a rectangular shape when viewed from above, the rectangular shape having long sides which extend in the long-side direction and short sides which extend in the short-side direction perpendicular to the long-side direction and are shorter than the long sides, and
wherein the first via-electrode and the second via-electrode are arranged along a straight line when viewed from above, the straight line extending substantially in the long-side direction.

29. The common mode noise filter according to claim 28, wherein the straight line along which the first via-electrode and the second via-electrode are arranged passes through a center of the laminated body in the short-side direction when viewed from above.

30. The common mode noise filter according to claim 29,
wherein the straight line along which the first via-electrode and the second via-electrode are arranged passes, when viewed from above, through a middle between the first inner end of the first coil conductor and an innermost portion of the first coil conductor facing the first inner end of the first coil conductor across the predetermined region, wherein the straight line along which the first via-electrode and the second via-electrode are arranged passes, when viewed from above, through a middle between the second inner end of the second coil conductor and an innermost portion of the second coil conductor facing the second inner end of the second coil conductor across the predetermined region, wherein the straight line along which the first via-electrode and the second via-electrode are arranged passes, when viewed from above, through a middle between the third inner end of the third coil conductor and an innermost portion of the third coil conductor facing the third inner end of the third coil conductor across the predetermined region, and wherein the straight line along which the first via-electrode and the second via-electrode are arranged passes, when viewed from above, through a middle between the fourth inner end of the fourth coil conductor and an innermost portion of the fourth coil conductor facing the fourth inner end of the fourth coil conductor across the predetermined region.

31. The common mode noise filter according to claim 4, wherein the first connection part, the second connection part, the third connection part, and the fourth connection part have substantially an identical length.

32. The common mode noise filter according to claim 24, wherein the first via-electrode and the second via-electrode are arranged substantially along a straight line when viewed from above, the straight line extending substantially in the long-side direction.

33. The common mode noise filter according to claim 32, wherein the straight line along which the first via-electrode and the second via-electrode are arranged passes, when viewed from above, through the center of the first coil conductor in the short-side direction.

34. A common mode noise filter, comprising:
 a laminated body including a first insulating layer, a second insulating layer, a third insulating layer, and a fourth insulating layer which are stacked on one another in an up-down direction;
 a first coil including:
  a first coil conductor disposed on an upper surface of the first insulating layer, the first coil conductor having a first outer end and a first inner end, the first coil conductor extending from the first outer end to the first inner end spirally about a predetermined region in a predetermined winding direction when viewed from above, and
  a second coil conductor disposed on an upper surface of the second insulating layer, the second coil conductor having a second outer end and a second inner end, the second coil conductor extending from the second inner end to the second outer end spirally about the predetermined region in the predetermined winding direction when viewed from above;
 a second coil including:
  a third coil conductor disposed on an upper surface of the third insulating layer, the third coil conductor having a third outer end and a third inner end, the third coil conductor extending from the third outer end to the third inner end spirally about the predetermined region in the predetermined winding direction when viewed from above, the third coil conductor facing the first coil conductor across the third insulating layer substantially in the up-down direction so as to be magnetically coupled to the first coil conductor, and
  a fourth coil conductor disposed on an upper surface of the fourth insulating layer, the fourth coil conductor having a fourth outer end and a fourth inner end, the fourth coil conductor extending from the fourth inner end to the fourth outer end spirally about the predetermined region in the predetermined winding direction when viewed from above, the fourth coil conductor facing the second coil conductor across one of the second and fourth insulating layers substantially in the up-down direction so as to be magnetically coupled to the second coil conductor;
 a first via-electrode passing through at least one of the first, second, third, and fourth insulating layers so as to connect the first coil conductor to the second coil conductor;
 a second via-electrode passing through at least one of the first, second, third, and fourth insulating layers so as to connect the third coil conductor to the fourth coil conductor;
 a first connection part connecting the first via-electrode to the first inner end of the first coil conductor,
 a second connection part connecting the first via-electrode to the second inner end of the second coil conductor;
 a third connection part connecting the second via-electrode to the third inner end of the third coil conductor; and
 a fourth connection part connecting the second via-electrode to the fourth inner end of the fourth coil conductor,
 wherein the first connection part overlaps the second connection part when viewed from above,
 wherein the third connection part overlaps the fourth connection part when viewed from above,
 wherein the first coil conductor has an outer border having a rectangular shape having long sides which extend in a long-side direction and short sides which extend in a short-side direction perpendicular to the long-side direction and are shorter than the long sides when viewed from above, and
 wherein the first, second, third, and fourth connection parts extend substantially perpendicularly to the long-side direction.

35. The common mode noise filter according to claim 34, wherein the first via-electrode and the second via-electrode are arranged substantially along a straight line when viewed from above, the straight line extending substantially in the long-side direction.

36. The common mode noise filter according to claim 35, wherein the straight line along which the first via-electrode and the second via-electrode are arranged passes, when viewed from above, through a center of the first coil conductor in the short-side direction.

37. The common mode noise filter according to claim 34, wherein the first and second via-electrodes are arranged substantially along a straight line extending in the long-side direction,
 wherein the first inner end of the first coil conductor and the second inner end of the second coil conductor are located on a same side with respect to the straight line when viewed from above, and wherein the third inner end of the third coil conductor and the fourth inner end of the fourth coil conductor are located on a same side with respect to the straight line when viewed from above.

38. The common mode noise filter according to claim 34, wherein the laminated body has a rectangular parallelepiped shape having a rectangular B shape when viewed from above, the rectangular shape having long sides which extend in the long-side B direction and short sides which extend in the short-side direction perpendicular to the long-side direction and are shorter than the long sides, and
wherein the first via-electrode and the second via-electrode are arranged along a straight line when viewed from above, the straight line extending substantially in the long-side direction.

39. The common mode noise filter according to claim 38, wherein the straight line along which the first via-electrode and the second via-electrode are arranged passes through a center of the laminated body in the short-side direction when viewed from above.

40. The common mode noise filter according to claim 39, wherein the straight line along which the first via-electrode and the second via-electrode are arranged passes, when viewed from above, through a middle between the first inner end of the first coil conductor and an innermost portion of the first coil conductor facing the first inner end of the first coil conductor across the predetermined region,
wherein the straight line passes, when viewed from above, through a middle between the second inner end of the second coil conductor and an innermost portion of the second coil conductor facing the second inner end of the second coil conductor across the predetermined region,
wherein the straight line passes, when viewed from above, through a middle between the third inner end of the third coil conductor and an innermost portion of the third coil conductor facing the third inner end of the third coil conductor across the predetermined region, and
wherein the straight line passes, when viewed from above, through a middle between the fourth inner end of the fourth coil conductor and an innermost portion of the fourth coil conductor facing the fourth inner end of the fourth coil conductor across the predetermined region.

41. The common mode noise filter according to claim 34, wherein the first connection part, the second connection part, the third connection part, and the fourth connection part have substantially an identical length.

42. The common mode noise filter according to claim 34,
wherein the first connection part is disposed on the upper surface of the first insulating layer,
wherein the second connection part is disposed on the upper surface of the second insulating layer,
wherein the third connection part is disposed on the upper surface of the third insulating layer, and
wherein the fourth connection part is disposed on the upper surface of the fourth insulating layer.

* * * * *